US012747890B2

(12) United States Patent
Kim

(10) Patent No.: US 12,747,890 B2
(45) Date of Patent: Sep. 29, 2026

(54) COOLING SYSTEM, A SEMICONDUCTOR APPARATUS INCLUDING THE SAME, AND A METHOD OF REPLACING A FILTER USING THE SAME

(71) Applicant: Samsung Electronics Co., Ltd., Suwon-si (KR)

(72) Inventor: Moonki Kim, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 361 days.

(21) Appl. No.: 18/235,575

(22) Filed: Aug. 18, 2023

(65) Prior Publication Data

US 2024/0263831 A1 Aug. 8, 2024

(30) Foreign Application Priority Data

Feb. 6, 2023 (KR) ........................ 10-2023-0015589

(51) Int. Cl.
*B01D 53/22* (2006.01)
*F24F 13/10* (2006.01)
*F24F 13/28* (2006.01)
*G03F 7/00* (2006.01)

(52) U.S. Cl.
CPC .............. *F24F 13/28* (2013.01); *F24F 13/10* (2013.01); *G03F 7/70858* (2013.01); *F24F 2221/56* (2013.01)

(58) Field of Classification Search
CPC ........ F24F 13/28; F24F 13/10; F24F 2221/56; G03F 7/70858
See application file for complete search history.

(56) References Cited

U.S. PATENT DOCUMENTS 4,088,460 A * 5/1978 Winter .................. B01D 53/04 96/144
6,558,247 B1 * 5/2003 Peak ...................... F24F 13/28 454/213
7,416,574 B2 8/2008 Udagawa et al.
8,398,753 B2 3/2013 Sergi et al.
9,901,760 B2 * 2/2018 Erb ........................ A62C 2/065
10,077,528 B2 * 9/2018 Yoichi ..................... D06F 58/22
10,639,578 B2 5/2020 Kitaguchi
2009/0113856 A1 * 5/2009 Cooper .................. E01H 1/053 55/283
2011/0122378 A1 5/2011 Katsura et al.
2012/0240772 A1 * 9/2012 Conyers .................. A61L 9/032 96/414
2018/0122676 A1 * 5/2018 Kong ........................ F24F 8/10
2018/0160750 A1 * 6/2018 Lin ...................... A62B 23/025
(Continued)

FOREIGN PATENT DOCUMENTS

JP 2000167325 A 6/2000
JP 2003007580 A 1/2003
(Continued)

*Primary Examiner* — Anthony Shumate
(74) *Attorney, Agent, or Firm* — Muir Patent Law, PLLC

(57) ABSTRACT

A cooling system includes an air supply unit, and a filter unit providing an air intake path and an air exhaust path. The filter unit includes a first filter part including a first filter and providing a first panel slot, a second filter part including a second filter and providing a second panel slot, and a blocking panel. The blocking panel is located in one of the first and second panel slots.

20 Claims, 10 Drawing Sheets

(56) References Cited

U.S. PATENT DOCUMENTS

| | | | | |
|---|---|---|---|---|
| 2020/0114724 | A1* | 4/2020 | Chauvel | B60H 1/00457 |
| 2021/0308612 | A1* | 10/2021 | Kato | A61L 2/202 |
| 2021/0340939 | A1* | 11/2021 | Sheidler | B01D 46/2411 |
| 2023/0219027 | A1* | 7/2023 | Laux | B01D 46/0041<br>95/287 |
| 2024/0159426 | A1* | 5/2024 | Kim | B01D 46/58 |

FOREIGN PATENT DOCUMENTS

| | | | |
|---|---|---|---|
| JP | 3553661 | B2 | 8/2004 |
| JP | 6714476 | B2 | 6/2020 |
| KR | 101168455 | B1 | 7/2012 |

* cited by examiner

COOLING SYSTEM, A SEMICONDUCTOR APPARATUS INCLUDING THE SAME, AND A METHOD OF REPLACING A FILTER USING THE SAME

CROSS-REFERENCE TO RELATED APPLICATIONS

This U.S. non-provisional patent application claims priority under 35 U.S.C. § 119 to Korean Patent Application No. 10-2023-0015589, filed on Feb. 6, 2023, in the Korean Intellectual Property Office, the entire contents of which are hereby incorporated by reference.

BACKGROUND OF THE INVENTION

The present disclosure relates to a cooling system, a semiconductor apparatus including the same, and a method of replacing a filter using the same. More particularly, the present disclosure relates to a cooling system including a plurality of filter parts, a semiconductor apparatus including the same, and a method of replacing a filter using the same.

Semiconductor devices are widely used in an electronic industry because of their small sizes, multi-functional characteristics, and/or low manufacturing costs. However, semiconductor devices have been highly integrated with the development of the electronic industry. Widths of patterns of semiconductor devices have been reduced to highly integrate the semiconductor devices. However, since new exposure techniques and/or expensive exposure techniques are needed to form fine patterns, it is difficult to highly integrate semiconductor devices. Thus, various researches are being conducted for new integration techniques.

SUMMARY

Embodiments of the inventive concepts may provide a cooling system including a plurality of filter parts, a semiconductor apparatus including the same, and a method of replacing a filter using the same.

In an aspect, a cooling system may include an air supply unit, and a filter unit providing an air intake path and an air exhaust path. The filter unit may include a first filter part including a first filter and providing a first panel slot, a second filter part including a second filter and providing a second panel slot, and a blocking panel. The blocking panel may be located in one of the first and second panel slots and may be configured to block a path of air through one of the first filter part and the second filter part.

In an aspect, a semiconductor apparatus may include a substrate processing apparatus, and a cooling system connected to the substrate processing apparatus. The cooling system may include an air supply unit and a filter unit. The filter unit may include first to third filter parts stacked in a vertical direction, and a blocking panel located in one of the first to third filter parts. The blocking panel may be configured to block a path of air through the one of the first to third filter parts.

In an aspect, a method of replacing a filter may include removing a blocking panel from a first filter part, locating the blocking panel in a second filter part, and replacing a filter of the second filter part. The replacing of the filter may include passing air through the first filter part.

DETAILED DESCRIPTION

Figure 1:
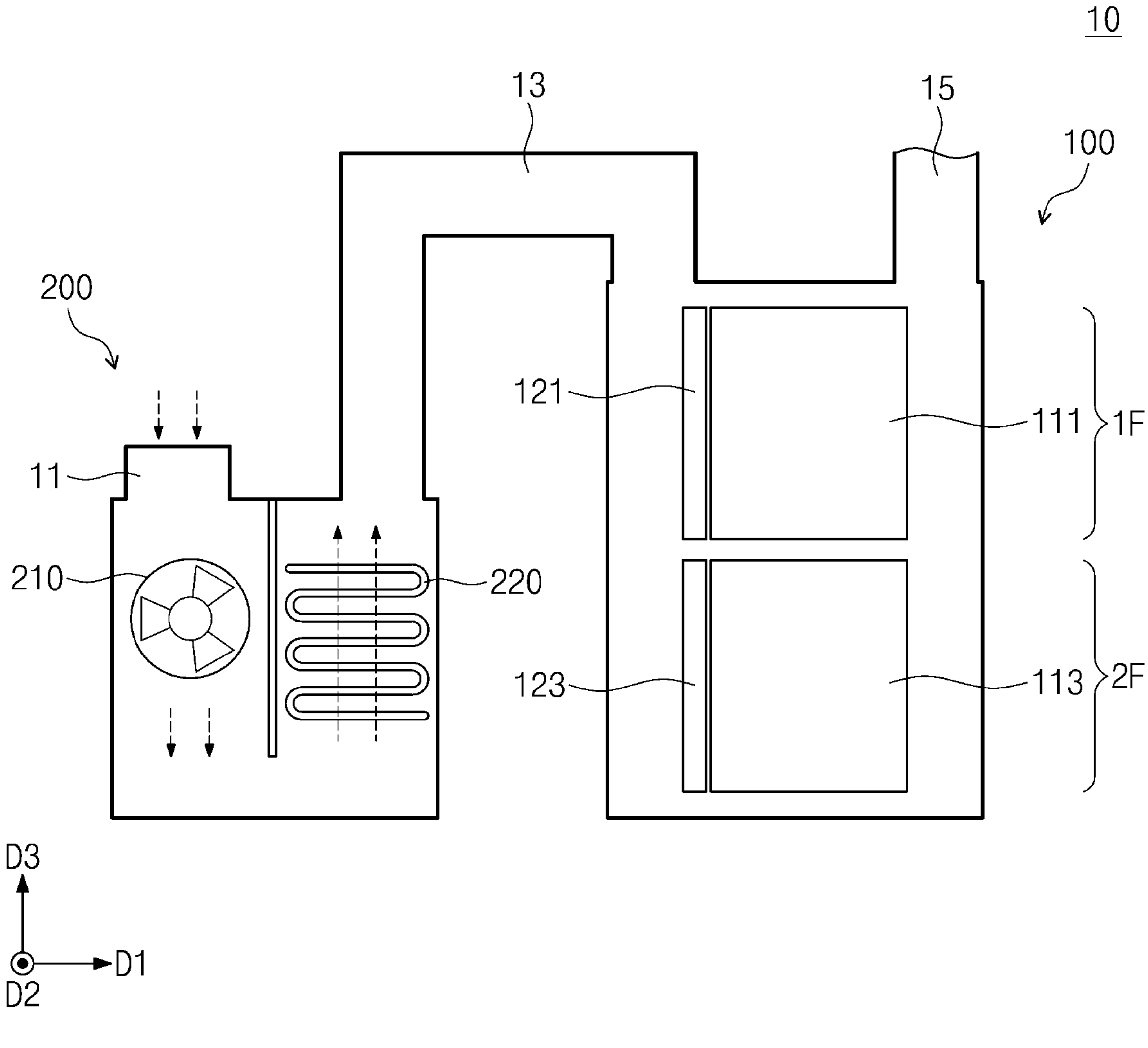
FIG. 1 is a cross-sectional view illustrating a cooling system according to example embodiments of the inventive concepts.

Embodiments of the inventive concepts will now be described more fully with reference to the accompanying drawings. The same reference numerals or the same reference designators may denote the same components or elements throughout the specification and drawings.

FIG. 1 is a cross-sectional view illustrating a cooling system according to example embodiments of the inventive concepts.

Referring to FIG. 1, a cooling system 10 may be provided. The cooling system 10 may include an air supply unit 200 and a filter unit 100. For example, the cooling system 10 may be an air-cooling system that cools using air. The term "air" as discussed herein, may refer to atmospheric air, or other gases that may be present during the manufacturing process.

The air supply unit 200 may include an intake port 11, a fan 210, and a first temperature control unit 220. The inside of the air supply unit 200 may be fluidly connected to the outside through the intake port 11. As used herein, items or locations described as being "fluidly connected" are configured such that a liquid or gas can flow, or be passed, from one item or location to the other. The fan 210 of the air supply unit 200 may be configured to suck outside air into the air supply unit 200. For example, the outside air may be moved into the inside of the air supply unit 200 through the intake port 11 by the fan 210. Sucked air may pass through the first temperature control unit 220 and then may move into a first pipe 13. The first temperature control unit 220 may be configured to control a temperature of the air to maintain a constant temperature. For example, the air supply unit 200 may be configured to supply the air having the constant temperature to the filter unit 100. For example, the first temperature control unit 220 may be a thermoelectric cooling unit including a Peltier element. The temperature of the air may range from about 20° C. to about 30° C.

The air supply unit 200 and the filter unit 100 may be fluidly connected to each other. More particularly, the air supply unit 200 and the filter unit 100 may be connected to each other through the first pipe 13. The first pipe 13 may be coupled to an upper portion of the air supply unit 200 and an upper portion of the filter unit 100. For example, the air having the constant temperature may move from the air supply unit 200 to the filter unit 100 through the first pipe 13.

The filter unit 100 may include a first filter part 1F and a second filter part 2F. The first filter part 1F may be located on the second filter part 2F. The first filter part 1F and the second filter part 2F may be spaced apart from each other in a vertical direction (e.g., a third direction D3). In other words, the first filter part 1F may be independent of the second filter part 2F. The first filter part 1F may include a first door 111 and a first panel door 121. The second filter part 2F may include a second door 113 and a second panel door 123. The filter unit 100 may be configured to remove a contaminant from the air provided through the first pipe 13 while the air passes through the filter unit 100. In other words, the filter unit 100 may be configured to remove the contaminant existing in the air. Functions and components of the filter unit 100 will be described in more detail with reference to FIGS. 2 to 5.

The filter unit 100 may be connected to a second pipe 15. The second pipe 15 may be spaced apart from the first pipe 13 and may be coupled to the upper portion of the filter unit 100. The second pipe 15 may be opposite to (or face) the first pipe 13. The second pipe 15 may be coupled to an external unit (not shown). In other words, the filter unit 100 may be connected to the external unit through the second pipe 15, and thus the air from which the contaminant is removed may be supplied to the external unit through the second pipe 15. In other words, the cooling system 10 according to the inventive concepts may supply the air, which has the constant temperature and from which the contaminant is removed, to the external unit, thereby uniformly maintaining performance of the external unit.

Figure 2:
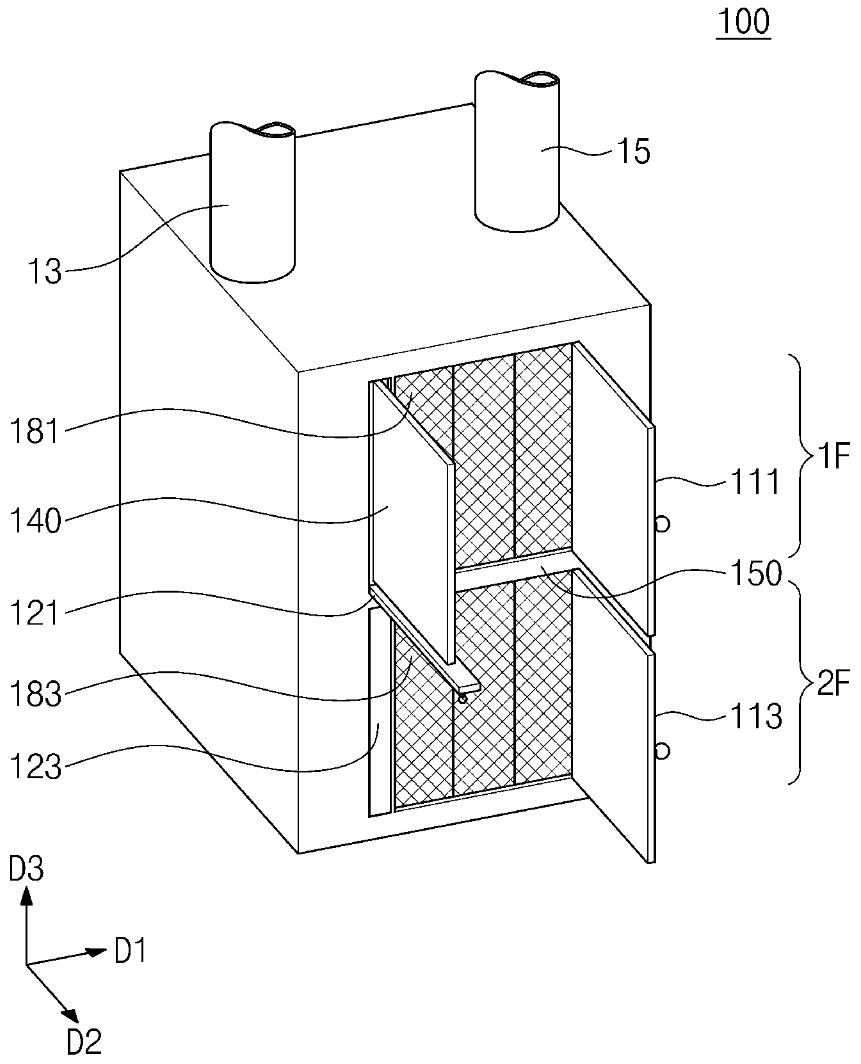
FIG. 2 is a perspective view illustrating a filter unit of a cooling system according to example embodiments of the inventive concepts.
Figure 3:
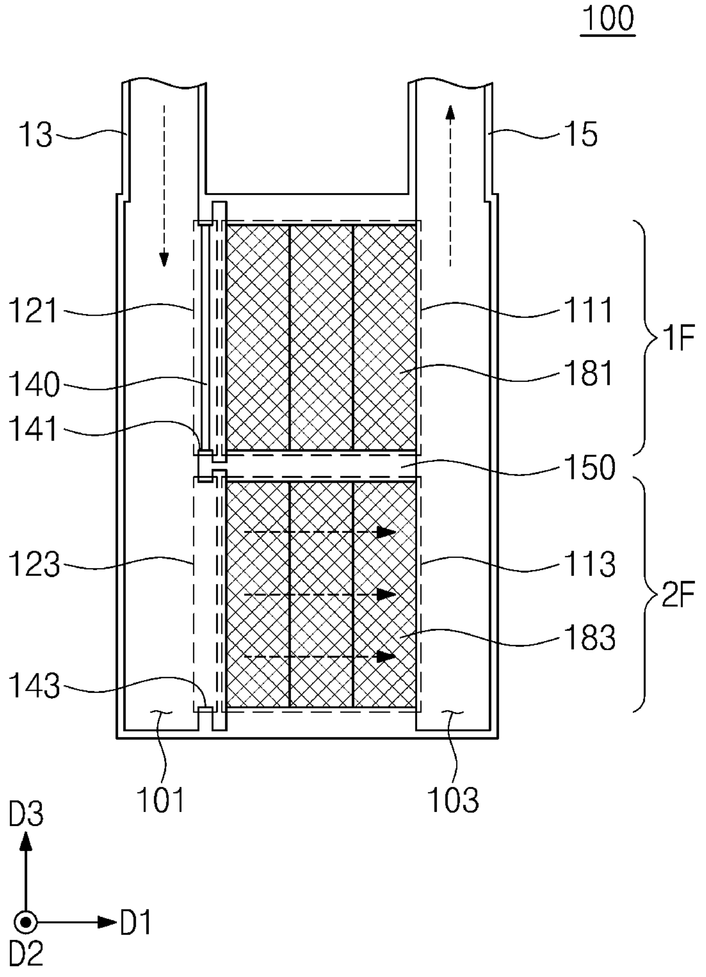
FIG. 3 is a cross-sectional view illustrating a filter unit of a cooling system according to example embodiments of the inventive concepts.

FIG. 2 is a perspective view illustrating a filter unit of a cooling system according to example embodiments of the inventive concepts. FIG. 3 is a cross-sectional view illustrating a filter unit of a cooling system according to example embodiments of the inventive concepts.

Referring to FIGS. 2 and 3, the filter unit 100 may include the first filter part 1F, the second filter part 2F, a separation guide 150 between the first filter part 1F and the second filter part 2F, and a blocking panel 140. The first filter part 1F may include the first door 111, the first panel door 121, and a first filter 181. The second filter part 2F may include the second door 113, the second panel door 123, and a second filter 183. The first door 111 and the first panel door 121 may be operated independently of each other. The second door 113 and the second panel door 123 may be operated independently of each other. In addition, the first door 111 and the second door 113 may be operated independently of each other, and the first panel door 121 and the second panel door 123 may be operated independently of each other. In other words, each of the first and second doors 111 and 113 and the first and second panel doors 121 and 123 may be individually opened and/or closed.

The first filter 181 may be configured to physically remove contaminant particles, dust, and/or motes included in the air. The first filter 181 may be configured to chemically remove an organic material, an acid, and/or alkali included in the air. In other words, the first filter 181 may be configured to remove foreign materials included in the air. For example, the first filter 181 may include at least one of a HEPA filter or a chemical filter. The second filter 183 may be the same as the first filter 181. In other words, the second filter 183 may be configured to remove foreign materials included in the air. For example, the second filter 183 may include at least one of a HEPA filter configured to physically remove contaminant particles, dust, and/or motes included in the air and/or a chemical filter configured to chemically remove an organic material, an acid, and/or alkali included in the air. Each of the first filter 181 and the second filter 183 may be provided in plurality, but embodiments of the inventive concepts are not limited thereto.

The first filter 181 may be movable through the first door 111. For example, the first filter 181 may be moved into and out of the first filter part 1F through the first door 111. The second filter 183 may be movable through the second door 113. For example, the second filter 183 may be moved into and out of the second filter part 2F through the second door 113. The first filter 181 and the second filter 183 may be separated from each other and may be operated independently of each other. For example, the first filter 181 and the second filter 183 may be individual components. Thus, in a filter replacing method to be described later, the first filter 181 and the second filter 183 may be individually replaced through the first door 111 and the second door 113 independent of each other. For example, a size of the first door 111 may be substantially equal to a size of the second door 113, but embodiments of the inventive concepts are not limited thereto.

The first panel door 121 may be spaced apart from the first door 111 in a first direction D1. A size of the first panel door 121 may be less than the size of the first door 111. For example, a width in the first direction D1 of the first panel door 121 may be less than a width in the first direction D1 of the first door 111. The blocking panel 140 may be movable through the first panel door 121. For example, the blocking panel 140 may be moved into and out of the first filter part 1F through the first panel door 121. The second panel door 123 may be spaced apart from the second door 113 in the first direction D1. A size of the second panel door 123 may be less than the size of the second door 113 and may be substantially equal to the size of the first panel door 121. For example, a width in the first direction D1 of the second panel door 123 may be less than a width in the first direction D1 of the second door 113. The blocking panel 140 may be movable through the second panel door 123.

The first filter part 1F may provide a first panel slot 141. The first panel slot 141 may be spaced apart from the first filter 181 and the first door 111 in the first direction D1. The second filter part 2F may provide a second panel slot 143, and the second panel slot 143 may be spaced apart from the second filter 183 and the second door 113 in the first direction D1. The first panel slot 141 and the second panel slot 143 may be closer to an air intake path 101 to be described later than to an air exhaust path 103 to be described later. The first panel slot 141 and the second panel slot 143 may be spaces in which the blocking panel 140 may be located. More particularly, the blocking panel 140 may move through the first panel door 121 or the second panel door 123 and then may be located in the first panel slot 141 or the second panel slot 143. Since the first panel door 121 and the second panel door 123 are independent of each other, the blocking panel 140 may easily move. For example, the blocking panel 140 may be easily removed from or easily inserted into the first or second filter part 1F or 2F through the first and second panel doors 121 and 123, respectively. Thus, the blocking panel 140 may be freely disposed in the first filter part 1F or the second filter part 2F.

The filter unit 100 may provide the air intake path 101 and the air exhaust path 103. The air intake path 101 and the air exhaust path 103 may be spaced apart from each other and may be located adjacent to both side surfaces of the filter unit 100, respectively. For example, the air intake path 101 may be adjacent to a first side surface of the filter unit 100, and the air exhaust path 103 may be adjacent to a second side surface of the filter unit 100, where the second side surface is opposite to the first side surface. In other words, the first filter part 1F, the second filter part 2F, the separation guide 150, and the blocking panel 140 may be located between the air intake path 101 and the air exhaust path 103. The air intake path 101 may be connected to the first pipe 13 and may have a shape extending in the third direction D3. The air exhaust path 103 may be connected to the second pipe 15 and may have a shape extending in the third direction D3. In other words, the air provided from the air supply unit 200 of FIG. 1 through the first pipe 13 may descend in parallel to the third direction D3 in the air intake path 101. Thereafter, the air may pass through the first filter part 1F or the second filter part 2F in a horizontal direction (e.g., the first direction D1) and then may rise in the third direction D3 in the air exhaust path 103. The air may flow into the second pipe 15.

In some embodiments, the blocking panel 140 may be located in the first panel slot 141 of the first filter part 1F. Due to the blocking panel 140 in the first panel slot 141, the air provided through the first pipe 13 may not move to the first filter 181 of the first filter part 1F. For example, the blocking panel 140 may block a path of air through the first filter part 1F. Thus, the air may descend to the second filter part 2F and then may pass through the second filter 183 of the second filter part 2F to flow into the second pipe 15 through the air exhaust path 103.

In certain embodiments, the blocking panel 140 may be located in the second panel slot 143 of the second filter part 2F. Due to the blocking panel 140 in the second panel slot 143, the air provided through the first pipe 13 may not move to the second filter 183 of the second filter part 2F. For example, the blocking panel 140 may block a path of air through the second filter part 2F. In this case, the air provided through the first pipe 13 may not move to the second filter 183 of the second filter part 2F but may pass through the first filter 181 of the first filter part 1F to flow into the second pipe 15 through the air exhaust path 103.

In other words, when the blocking panel 140 is located in the first panel slot 141 of the first filter part 1F or the second panel slot 143 of the second filter part 2F, the air may move to only one of the first filter part 1F and the second filter part 2F. For example, when the blocking panel 140 is located in the first panel slot 141 of the first filter part 1F, the blocking panel 140 may prevent the air from passing through the first filter 181 of the first filter part 1F. And when the blocking panel 140 is located in the second panel slot 143 of the second filter part 2F, the blocking panel 140 may prevent the air from passing through the second filter part 2F. Thus, the flowing of the air to one of the first and second filter parts 1F and 2F may be blocked to easily replace the filter while operating the cooling system.

The separation guide 150 provided between the first filter part 1F and the second filter part 2F may separate the first and second filter parts 1F and 2F from one another. In example embodiments, the separation guide 150 may prevent air that is flowing through one of the first filter part 1F or the second filter part 2F from moving through the other one of the first filter part 1F or the second filter part 2F. For example, when the blocking panel 140 is located in the first panel slot 141 of the first filter part 1F, the separation guide 150 may prevent the air flowing through the second filter part 2F from being drawn into the first filter part 1F. And when the blocking panel 140 is located in the second panel slot 143 of the second filter part 2F, the separation guide 150 may prevent the air flowing through the first filter part 1F from being drawn into the second filter part 2F.

Figure 4:
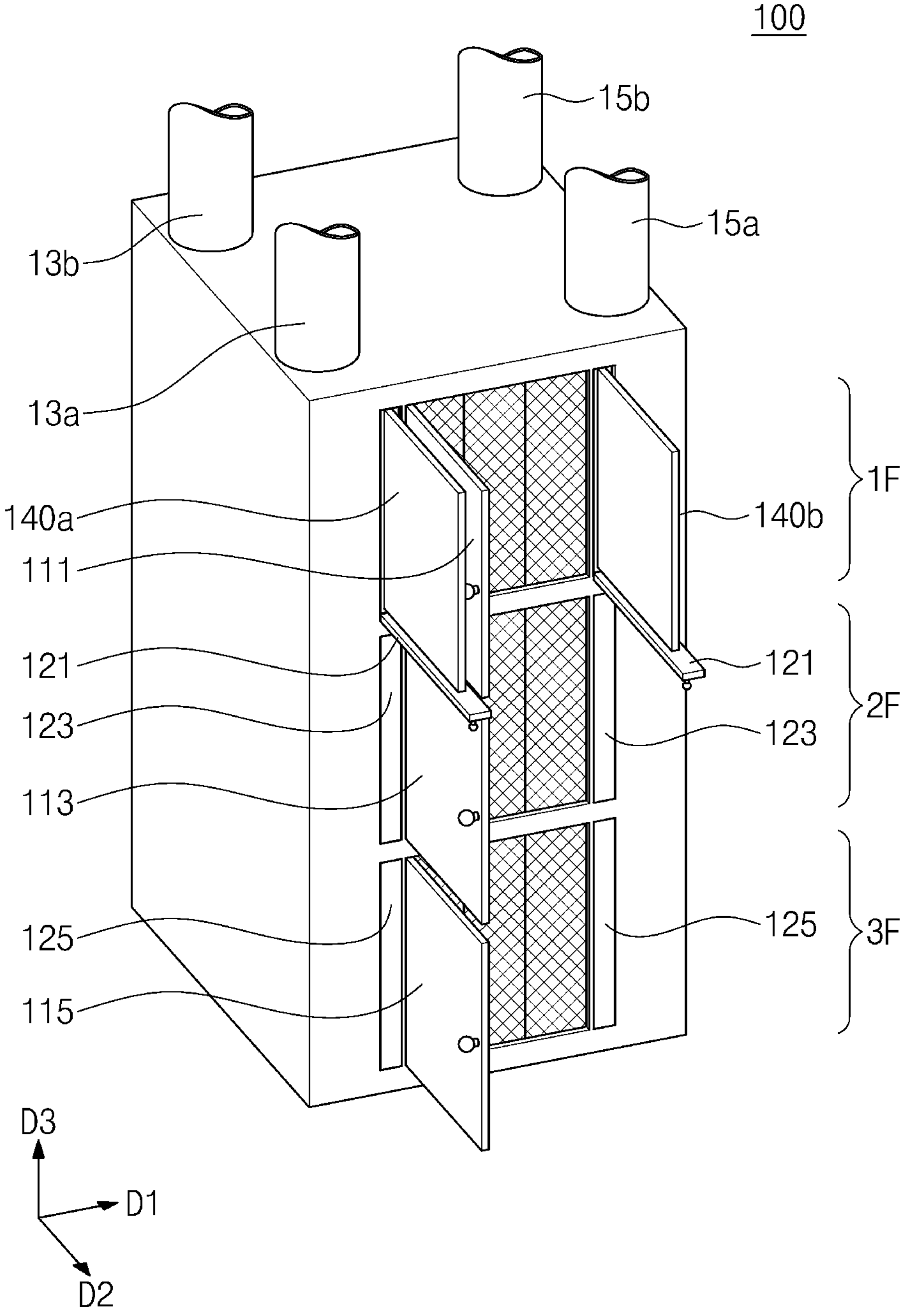
FIG. 4 is a perspective view illustrating a filter unit of a cooling system according to example embodiments of the inventive concepts.
Figure 5:
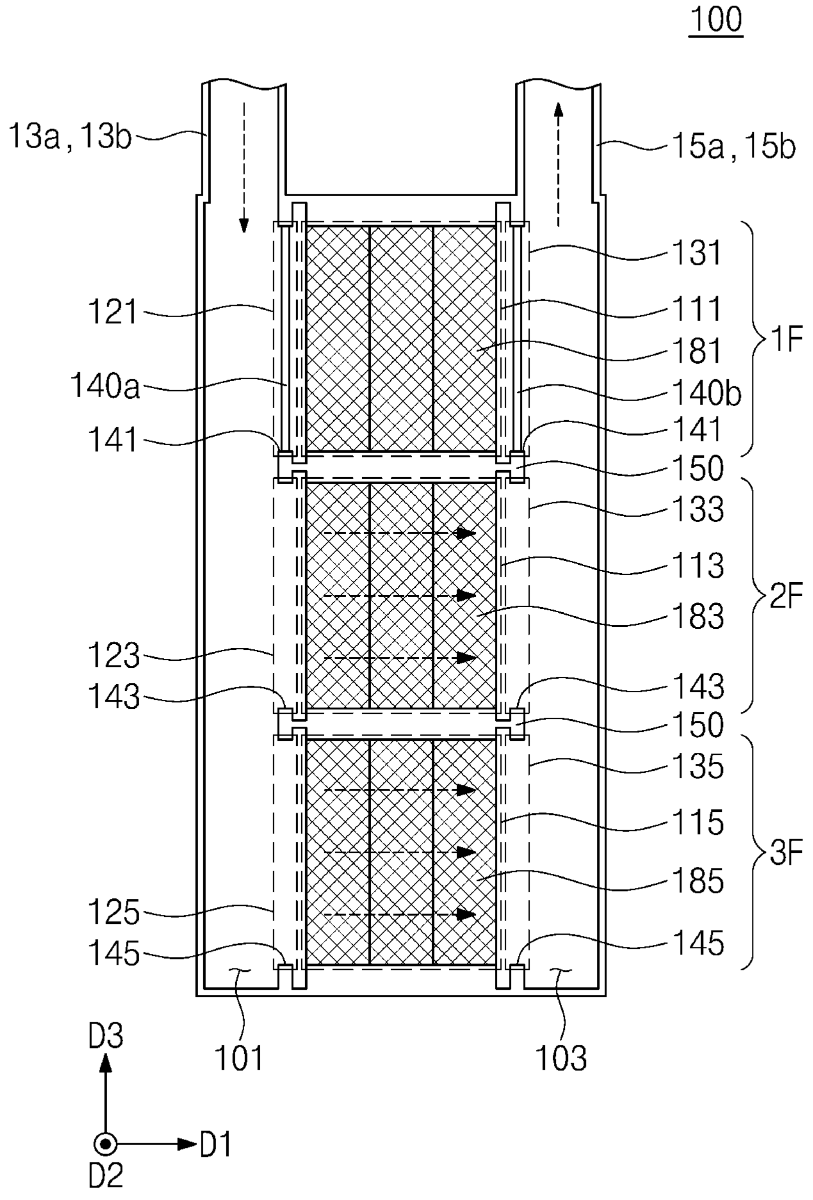
FIG. 5 is a cross-sectional view illustrating a filter unit of a cooling system according to example embodiments of the inventive concepts.

FIG. 4 is a perspective view illustrating a filter unit of a cooling system according to example embodiments of the inventive concepts. FIG. 5 is a cross-sectional view illustrating a filter unit of a cooling system according to example embodiments of the inventive concepts.

Hereinafter, the descriptions of the same features as mentioned with reference to FIGS. 2 and 3 will not be repeated and differences between the present embodiments and the above embodiments of FIGS. 2 and 3 will be mainly described, for the purpose of ease and convenience in explanation.

Referring to FIGS. 4 and 5, a filter unit 100 may further include a third filter part 3F. The third filter part 3F may be located under the second filter part 2F. A separation guide 150 may be located between the third filter part 3F and the second filter part 2F, and thus the third filter part 3F may be spaced apart from the second filter part 2F. In other words, the first to third filter parts 1F, 2F and 3F may be spaced apart from each other in a vertical direction, and the second filter part 2F may be located between the first and third filter parts 1F and 3F.

Each of the first to third filter parts 1F, 2F and 3F may include a plurality of panel doors. For example, the first filter part 1F may include two first panel doors 121. The first filter 181 and the first door 111 may be located between the first panel doors 121. In other words, the first panel doors 121 may be provided at both sides of the first door 111, respectively. Each of the second filter part 2F and the third filter part 3F may be substantially the same as the first filter part 1F. In other words, the second filter part 2F may include two second panel doors 123 located at both sides of the second door 113, respectively. The third filter part 3F may include two third panel doors 125 located at both sides of a third door 115, respectively.

Each of the first to third filter parts 1F, 2F and 3F may provide a plurality of panel slots. For example, the first filter part 1F may provide two first panel slots 141. The first panel slots 141 may be located at both sides of the first filter 181, respectively. For example, one of the first panel slots 141 may be adjacent to the air intake path 101, and the other of the first panel slots 141 may be adjacent to the air exhaust path 103. Each of the second filter part 2F and the third filter part 3F may be substantially the same as the first filter part 1F. For example, the second filter part 2F may provide two second panel slots 143 located at both sides of the second filter 183, with one second panel slot 143 provided at a first side of the second filter 183 and the other second panel slot 143 provided at a second side of the second filter 183. The third filter part 3F may provide two third panel slots 145 located at both sides of a third filter 185, with one third panel slot 145 provided at a first side of the third filter 185 and the other third panel slot 145 provided at a second side of the third filter 185.

A blocking panel may include a first blocking panel 140*a* and a second blocking panel 140*b*. The first and second blocking panels 140*a* and 140*b* may be movable through the first to third panel doors 121, 123, and 125. The first to third panel slots 141, 143, and 145 may be spaces in which the first and second blocking panels 140*a* and 140*b* may be located. In other words, the first and second blocking panels 140*a* and 140*b* may be located in the first to third panel slots 141, 143, and 145 through the first to third panel doors 121, 123, and 125. For example, the first and second blocking panels 140*a* and 140*b* may be located in the first panel slots 141 through the first panel doors 121. In other words, the first and second blocking panels 140*a* and 140*b* may be located at both sides of the first filter 181. Thus, due to the first blocking panel 140*a*, air provided through first pipes 13*a* and 13*b* may not move to the first filter 181 in the air intake path 101. Due to the second blocking panel 140*b*, air provided into second pipes 15*a* and 15*b* may not move to the first filter 181 in the air exhaust path 103. In other words, the first filter 181 may be sealed or shielded by the first and second blocking panels 140*a* and 140*b*, and thus the air may not flow to the first filter 181.

As another example, the first and second blocking panels 140*a* and 140*b* may be located in the second panel slots 143 through the second panel doors 123. For example, the first and second blocking panels 140*a* and 140*b* may be located at both sides of the second filter 183. Thus, due to the first blocking panel 140*a*, air provided through first pipes 13*a* and 13*b* may not move through the second filter 183 in the air intake path 101. Due to the second blocking panel 140*b*, air provided into second pipes 15*a* and 15*b* may not move through the second filter 183 in the air exhaust path 103. For example, the second filter 183 may be sealed or shielded by the first and second blocking panels 140*a* and 140*b*, and thus the air may not flow to the second filter 183.

As a still further example, the first and second blocking panels 140*a* and 140*b* may be located in the third panel slots 145 through the third panel doors 125. For example, the first and second blocking panels 140*a* and 140*b* may be located at both sides of the third filter 185. Thus, due to the first blocking panel 140*a*, air provided through first pipes 13*a* and 13*b* may not move through the third filter 185 in the air intake path 101. Due to the second blocking panel 140*b*, air provided into second pipes 15*a* and 15*b* may not move through the third filter 185 in the air exhaust path 103. For example, the third filter 185 may be sealed or shielded by the first and second blocking panels 140*a* and 140*b*, and thus the air may not flow to the third filter 185.

In some embodiments, the first and second blocking panels 140*a* and 140*b* may not be provided in the second filter part 2F and the third filter part 3F. Thus, the air provided through the first pipes 13*a* and 13*b* may pass through the second and third filters 183 and 185 and then may exit into the second pipes 15*a* and 15*b*. In other words, a greater amount of the air than FIGS. 2 and 3 may pass through the filters. In addition, since the filter unit 100 includes two first pipes 13*a* and 13*b* and two second pipes 15*a* and 15*b*, the greater amount of the air than FIGS. 2 and 3 may enter and exit from the filter unit 100. In other words, the amount of the air supplied from the cooling system may be adjusted depending on the number of the first pipes 13*a* and 13*b*, the number of the second pipes 15*a* and 15*b* and the number of the plurality of filter parts 1F, 2F and 3F.

The separation guide 150 provided between the second filter part 2F and the third filter part 3F may separate the second and third filter parts 2F and 3F from one another. In example embodiments, the separation guide 150 between the second filter part 2F and the third filter part 3F may prevent air flowing through one of the second filter part 2F or the third filter part 3F from moving through the other one of the second filter part 2F or the third filter part 3F. For example, when the first and second blocking panels 140*a* and 140*b* are located in the second panel slots 143 of the second filter part 2F, the separation guide 150 may prevent the air that is flowing through the third filter part 3F from being drawn into the second filter part 2F. And when the first and second blocking panels 140*a* and 140*b* are located in the third panel slots 145 of the third filter part 3F, the separation guide 150 may prevent the air that is flowing through the second filter part 2F from being drawn into the third filter part 3F.

Figure 6:
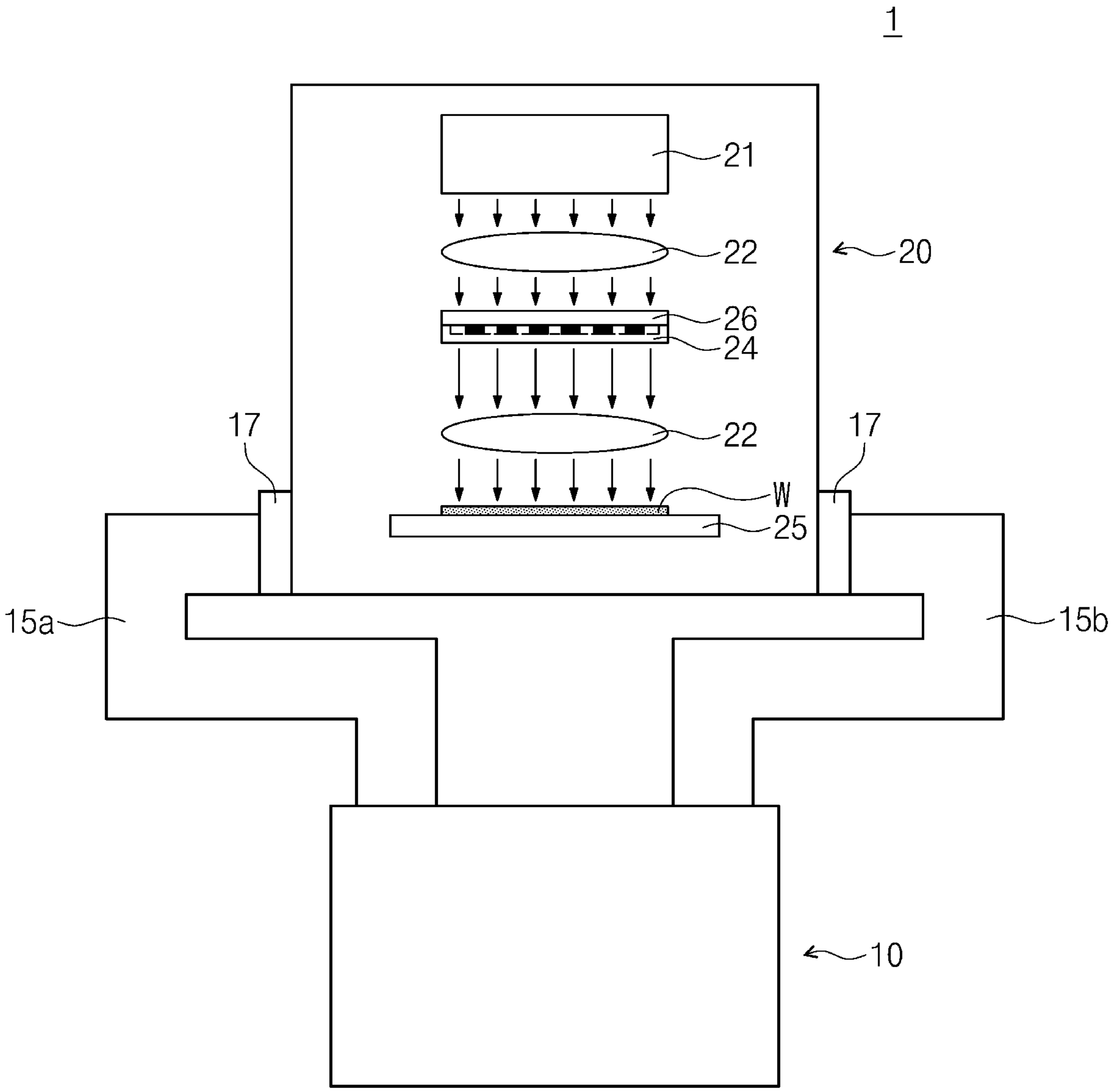
FIG. 6 is a cross-sectional view illustrating a semiconductor apparatus according to example embodiments of the inventive concepts.

FIG. 6 is a cross-sectional view illustrating a semiconductor apparatus according to example embodiments of the inventive concepts.

Referring to FIG. 6, a semiconductor apparatus 1 for performing a semiconductor process may be provided. The semiconductor apparatus 1 may include a substrate processing apparatus 20 and a cooling system 10. The substrate processing apparatus 20 may be connected to the cooling system 10. The cooling system 10 may be substantially the same as the cooling system 10 of FIG. 1, which includes the filter unit 100 described with reference to FIGS. 2 to 5.

The substrate processing apparatus 20 may include a light source 21, lenses 22, a reticle stage 24, a substrate stage 25, and a reticle 26. For example, the substrate processing apparatus 20 may be a scanner exposure apparatus. For example, the substrate processing apparatus 20 may include an ArF exposure apparatus or a KrF exposure apparatus.

The light source 21 may be configured to generate light and to provide the generated light to a substrate W. The light may include excimer laser light or deep ultraviolet light. For example, the light may have a wavelength of 193 nm (ArF), 248 nm (KrF), 365 nm (i-line), or 436 nm (G-line).

The lenses 22 may be located between the light source 21 and the substrate stage 25. More particularly, the lenses 22 may be provided between the light source 21 and the reticle 26 and between the reticle 26 and the substrate stage 25, respectively. The lenses 22 may include an illumination optical lens and a projection optical lens. The illumination optical lens may magnify and/or reduce projection of the light. Alternatively, the illumination optical lens may change a path of the light and/or may collimate the light. The projection optical lens may include an objective lens (e.g., a convex lens). The projection optical lens may focus light transmitted through the reticle 26 to the substrate W.

The substrate stage 25 may be located under the light source 21 and the lenses 22. The substrate stage 25 may be configured to receive the substrate W. The substrate stage 25 may be configured to move the substrate W in a horizontal direction. The substrate W may include a silicon wafer, but embodiments of the inventive concepts are not limited thereto.

The reticle 26 and the reticle stage 24 may be provided between the lenses 22. The reticle 26 may be provided on the reticle stage 24. The reticle stage 24 may receive the reticle 26 and may be configured to move the reticle 26. For example, the reticle 26 may be a transmission photomask. The reticle 26 may be configured to project the light to the substrate W.

The substrate processing apparatus 20 and the cooling system 10 may be connected to each other through second pipes 15*a* and 15*b*. The second pipes 15*a* and 15*b* may be substantially the same as the second pipes 15*a* and 15*b* described with reference to FIGS. 4 and 5. The second pipes 15*a* and 15*b* may be coupled to side surfaces of the substrate processing apparatus 20, respectively. For example, one of the second pipes 15*a* and 15*b* may be coupled to a left side surface of the substrate processing apparatus 20. The other of the second pipes 15*a* and 15*b* may be coupled to a right side surface of the substrate processing apparatus 20. In other words, the second pipes 15*a* and 15*b* may be opposite to each other and may be coupled to the substrate processing apparatus 20.

A second temperature control unit 17 may be provided between the substrate processing apparatus 20 and the cooling system 10. More particularly, the second temperature control unit 17 may be located at a place closer to the substrate processing apparatus 20 than to the cooling system

10. The second temperature control unit 17 may control a temperature of air provided into the substrate processing apparatus 20 through the second pipes 15*a* and 15*b*. In other words, the air having a constant temperature may be supplied into the substrate processing apparatus 20 by the second temperature control unit 17. Thus, the substrate processing apparatus 20 may be supplied with the air having the constant temperature to maintain uniform performance.

Figure 7:
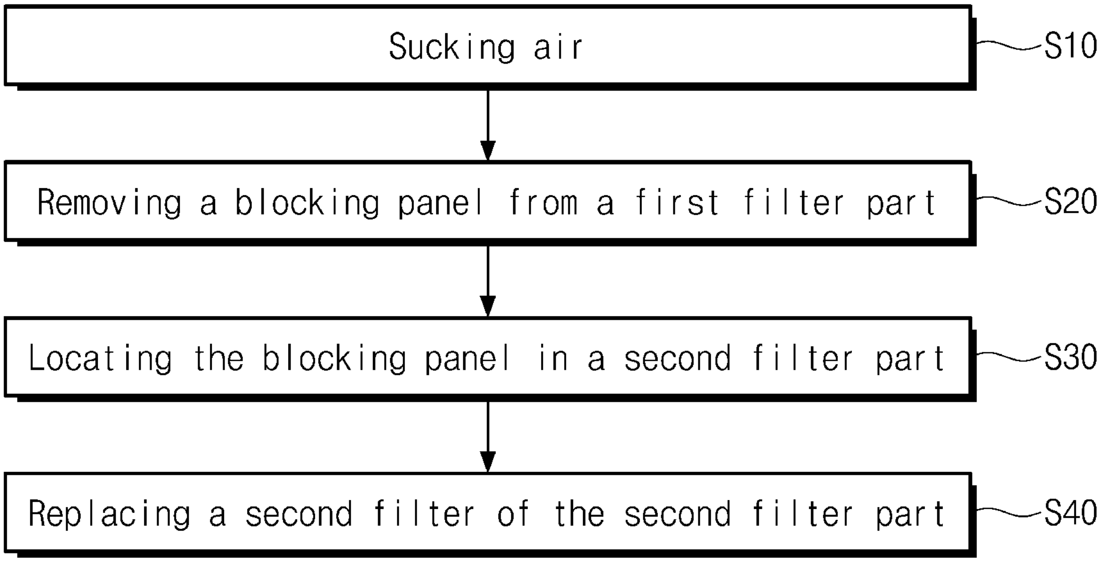
FIG. 7 is a flow chart illustrating a method of replacing a filter according to example embodiments of the inventive concepts.
Figure 8:
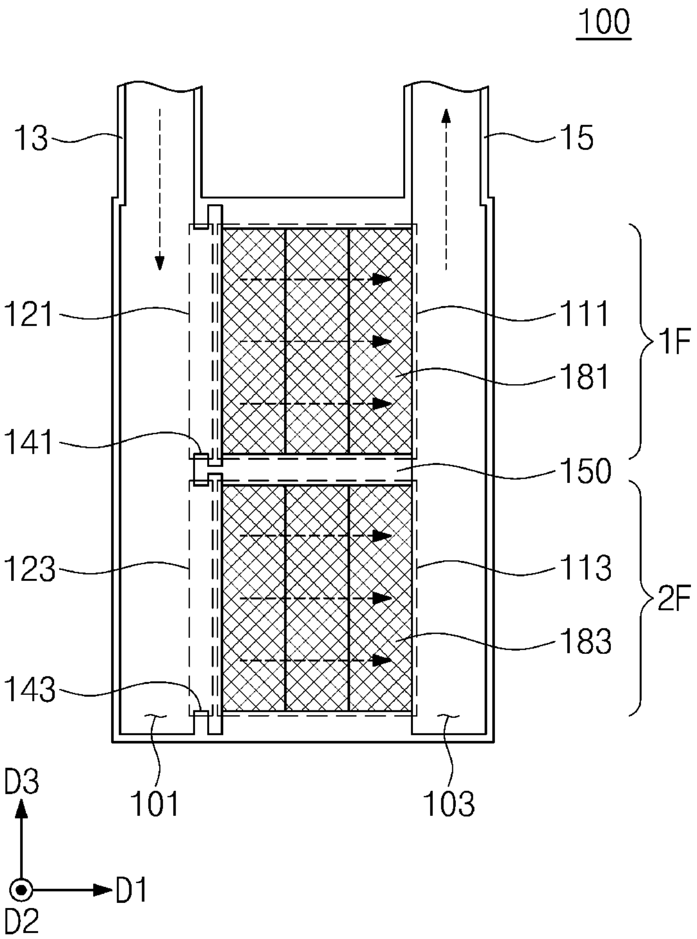
FIGS. 8 to 10 are cross-sectional views illustrating a method of replacing a filter according to example embodiments of the inventive concepts.
Figure 9:
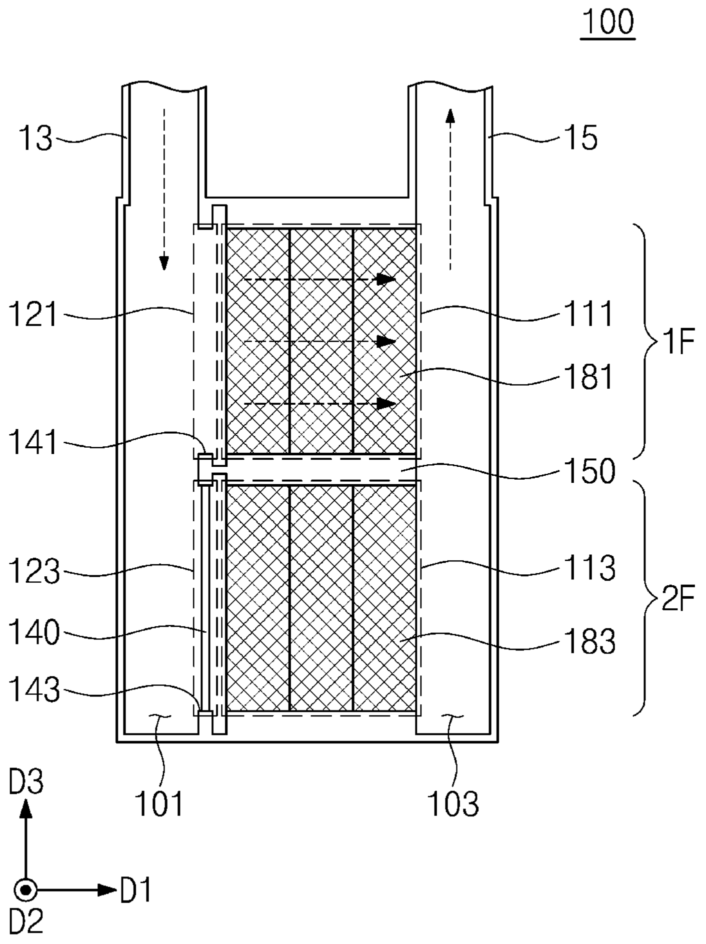
Figure 10:
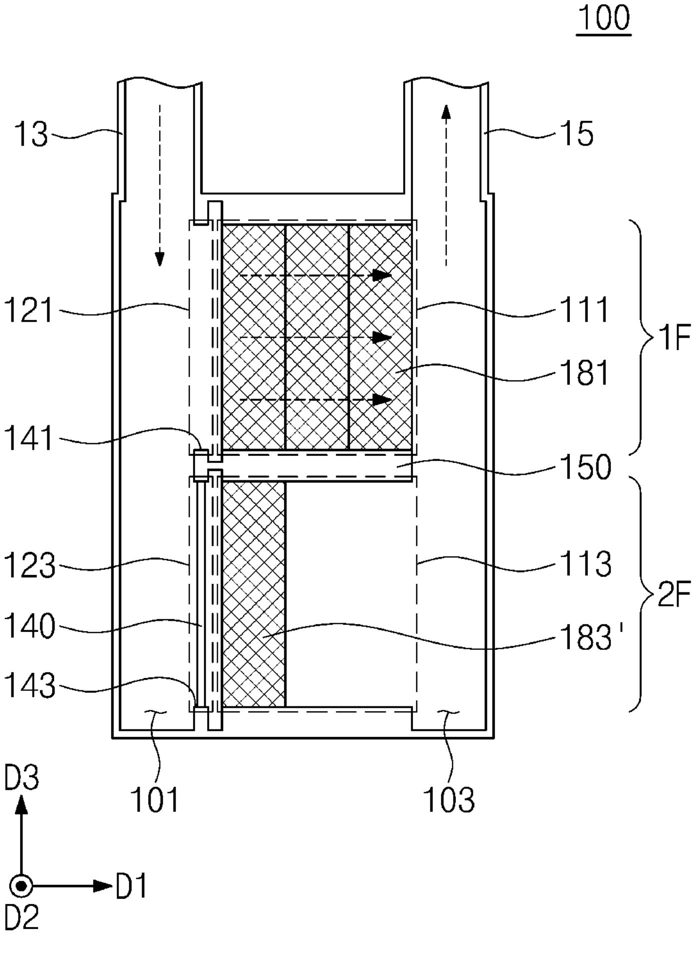

FIG. 7 is a flow chart illustrating a method of replacing a filter according to example embodiments of the inventive concepts. FIGS. 8 to 10 are cross-sectional views illustrating a method of replacing a filter according to example embodiments of the inventive concepts.

Referring to FIG. 7, a method of replacing a filter may include sucking air (S10), removing a blocking panel from a first filter part (S20), locating the blocking panel in a second filter part (S30), and replacing a second filter of the second filter part (S40). The sucking of the air (S10) may be performed by the air supply unit 200 of FIG. 1.

Referring to FIGS. 3, 7 and 8, the removing of the blocking panel from the first filter part (S20) may include opening and closing the first panel door 121, and passing the air through the first filter part 1F.

The first panel door 121 may be operated independently of the first door 111, the second door 113, and the second panel door 123. After the first panel door 121 is opened, the blocking panel 140 may be removed from the first panel slot 141, and then, the first panel door 121 may be closed. The blocking panel 140 may be easily removed from the first filter part 1F without affecting the second filter part 2F and the first filter 181 of the first filter part 1F.

Since the blocking panel 140 is removed from the first panel slot 141, the air provided from the first pipe 13 may move from the air intake path 101 to the first filter part 1F. For example, the air provided from the first pipe 13 may move from the air intake path 101 to the air exhaust path 103 through the first and second filter parts 1F and 2F and then may be provided into the second pipe 15.

Referring to FIGS. 7 and 9, the locating of the blocking panel in the second filter part (S30) may include opening and closing the second panel door 123, and preventing the air from passing through the second filter part 2F.

The second panel door 123 may be operated independently of the first door 111, the first panel door 121, and the second door 113. After the second panel door 123 is opened, the blocking panel 140 may be inserted into the second panel slot 143, and then, the second panel door 123 may be closed. For example, the blocking panel 140 may be easily located in the second panel slot 143 of the second filter part 2F without affecting the first filter part 1F and the second filter 183 of the second filter part 2F.

Since the blocking panel 140 is located in the second panel slot 143, the air provided from the first pipe 13 may not move from the air intake path 101 to the second filter part 2F. In other words, the air provided from the first pipe 13 may move from the air intake path 101 to the air exhaust path 103 through only the first filter part 1F and then may be provided into the second pipe 15.

Referring to FIGS. 7 and 10, the replacing of the second filter of the second filter part (S40) may include opening and closing the second door 113, and passing the air through the first filter part 1F.

The second door 113 may be operated independently of the first door 111, the first panel door 121, and the second panel door 123. After the second door 113 is opened, the second filter 183 may be replaced with a new second filter 183'. After the second filter 183 is replaced with the new second filter 183', the second door 113 may be closed. For example, the second filter 183 of the second filter part 2F may be easily replaced with the new one without affecting the first filter part 1F.

While replacing the second filter 183, since the blocking panel 140 is located in the second filter part 2F, the air provided from the first pipe 13 may pass through only the first filter part 1F but may not pass through the second filter part 2F. In other words, the air passing through the first filter part 1F may move into the second pipe 15, and thus during the replacing of the second filter 183, the filter unit 100 may continuously supply the air from which the foreign materials are removed.

In the filter unit 100 described with reference to FIGS. 4 and 5, the second filter 183 and the third filter 185 may be replaced with new filters while sequentially locating the first and second blocking panels 140*a* and 140*b* in the second and third filter parts 2F and 3F. More particularly, the first and second blocking panels 140*a* and 140*b* may be located in the second filter part 2F, and then, the second filter 183 may be replaced with the new filter. Thereafter, the first and second blocking panels 140*a* and 140*b* may be removed from the second filter part 2F, the first and second blocking panels 140*a* and 140*b* may be located in the third filter part 3F, and then, the third filter 185 may be replaced with the new filter.

In other words, the method of replacing the filter of the filter unit 100 may replace the filter with a new filter without stopping the cooling system 10 of FIG. 1. For example, the blocking panel 140 may be located in one of the plurality of filter parts, and the filter of the one filter part may be replaced with the new one. During the replacing of the filter, other filter part(s) may remove the foreign materials included in the air, and thus the cooling system 10 may be continuously operated. As a result, the semiconductor process may be continuously performed in the substrate processing apparatus 20 of FIG. 6 during the replacing of the filter of the filter unit 100, and thus productivity of the semiconductor apparatus 1 may be improved.

The cooling system and the semiconductor apparatus including the same according to the embodiments of the inventive concepts may include the blocking panel. The blocking panel may be located in one of the plurality of filter parts. The air may not pass through the filter part in which the blocking panel is located, and thus the filter of the filter part may be easily replaced with a new one.

In the method of replacing a filter according to the embodiments of the inventive concepts, the blocking panel may be located in one of the plurality of filter parts, and then, the filter may be replaced with a new filter. The air may pass through the filter part in which the blocking panel is not located, and thus the cooling system may be continuously operated during the replacing of the filter. As a result, the productivity of the semiconductor apparatus including the cooling system may be improved.

While the embodiments of the inventive concepts have been particularly shown and described, it will be understood by one of ordinary skill in the art that variations in form and detail may be made therein without departing from the spirit and scope of the attached claims.

What is claimed is:

1. A cooling system comprising:

an air supplier comprising a fan configured to suck air and a thermoelectric cooler; and a filter unit providing an air intake path and an air exhaust path, wherein the filter unit comprises:

a first filter part including a first filter and providing a first panel slot;

a second filter part including a second filter and providing a second panel slot; and a blocking panel, and wherein the blocking panel is located in one of the first and second panel slots and is configured to block a path of air through one of the first filter part and the second filter part.

2. The cooling system of claim 1, wherein the blocking panel is closer to the air intake path than to the air exhaust path.

3. The cooling system of claim 1, wherein the air intake path and the air exhaust path are provided adjacent to side surfaces of the filter unit, respectively, and are opposite to each other.

4. The cooling system of claim 1, wherein the filter unit further comprises:

a first pipe and a second pipe, wherein the first pipe is connected to the air intake path, and wherein the second pipe is connected to the air exhaust path.

5. The cooling system of claim 1, wherein the filter unit further comprises:

a first door and a second door, wherein the first door and the second door are configured to be operated independently of each other.

6. The cooling system of claim 1, wherein the filter unit further comprises:

a first panel door and a second panel door, through which the blocking panel is movable, wherein the first panel door and the second panel door are separated from each other.

7. The cooling system of claim 1, wherein the blocking panel includes a first blocking panel and a second blocking panel, and wherein the first filter or the second filter is located between the first blocking panel and the second blocking panel.

8. The cooling system of claim 1, wherein the first filter part and the second filter part are stacked in a vertical direction.

9. The cooling system of claim 1, wherein the filter unit further comprises:

a separation guide panel between the first filter part and the second filter part and separating the first filter part from the second filter part.

10. A cooling system comprising:

an air supplier comprising a fan configured to suck air; and a filter unit providing an air intake path and an air exhaust path, wherein the filter unit comprises:

a first filter part including a first filter and providing a first panel slot;

a second filter part including a second filter and providing a second panel slot; and a blocking panel, wherein the blocking panel is located in one of the first panel slot or the second panel slot and is configured to block a path of air through one of the first filter part or the second filter part, and wherein the air intake path extends in a vertical direction along a region adjacent to at least one of the first panel slot and the second panel slot.

11. The cooling system of claim 10, wherein the filter unit further comprises:

a first pipe connected to the air intake path; and a second pipe connected to the air exhaust path.

12. The cooling system of claim 10, wherein the air supplier comprises:

a thermoelectric cooler.

13. The cooling system of claim 10, wherein the blocking panel includes a first blocking panel and a second blocking panel, and wherein the first filter or the second filter is located between the first blocking panel and the second blocking panel.

14. The cooling system of claim 10, wherein the first filter part and the second filter part are stacked in the vertical direction.

15. A cooling system comprising:

an air supplier comprising a fan configured to suck air; and a filter unit providing an air intake path and an air exhaust path, wherein the filter unit comprises:

a first filter part including a first filter and providing a first panel slot;

a second filter part stacked on the first filter part, the second filter part including a second filter and providing a second panel slot; and a blocking panel, wherein the blocking panel is located in one of the first panel slot or the second panel slot and is configured to block a path of air through one of the first filter part or the second filter part, and wherein the air intake path extends in a vertical direction along a region adjacent to at least one of the first panel slot and the second panel slot.

16. The cooling system of claim 15, wherein when the blocking panel is located in the first panel slot, the path of air extends from the air intake path through the second filter to the air exhaust path, and wherein when the blocking panel is located in the second panel slot, the path of air extends from the air intake path through the first filter to the air exhaust path.

17. The cooling system of claim 15, wherein the filter unit further comprises:

a first pipe connected to the air intake path; and a second pipe connected to the air exhaust path.

18. The cooling system of claim 15, wherein the air supplier comprises:

a thermoelectric cooler.

19. The cooling system of claim 15, wherein the blocking panel includes a first blocking panel and a second blocking panel, and wherein the first filter or the second filter is located between the first blocking panel and the second blocking panel.

20. The cooling system of claim 15, wherein the filter unit further comprises:

a first panel door and a second panel door, through which the blocking panel is movable, wherein the first panel door and the second panel door are separated from each other.

* * * * *